US011630137B2

(12) United States Patent
Campbell et al.

(10) Patent No.: US 11,630,137 B2
(45) Date of Patent: Apr. 18, 2023

(54) RELIABLE HARDWARE METERING

(71) Applicant: Lenovo Enterprise Solutions (Singapore) Pte. Ltd., Singapore (SG)

(72) Inventors: Keith M. Campbell, Cary, NC (US); Samer El-Haj-Mahmoud, Charlotte, NC (US); Sumeet Kochar, Cary, NC (US)

(*) Notice: Subject to any disclaimer, the term of this patent is extended or adjusted under 35 U.S.C. 154(b) by 169 days.

(21) Appl. No.: 16/915,970

(22) Filed: Jun. 29, 2020

(65) Prior Publication Data

US 2021/0405097 A1 Dec. 30, 2021

(51) Int. Cl.
*G01R 21/00* (2006.01)
*G06Q 50/06* (2012.01)

(52) U.S. Cl.
CPC ......... *G01R 21/006* (2013.01); *G01R 21/001* (2013.01); *G06Q 50/06* (2013.01)

(58) Field of Classification Search
CPC .. G01R 21/006; G01R 21/002; G01R 21/001; G01R 21/06; G06Q 50/06; H04L 43/08; H04L 43/06; H04L 29/0604; H04L 67/2828; H04L 69/04; H04L 29/08783; H04L 29/08792; H04L 67/1002; H04L 41/24; H04N 21/4425; H04N 21/24; H04N 7/03; H04N 21/835; H04N 1/32683;

(Continued)

(56) References Cited

U.S. PATENT DOCUMENTS 10,720,001 B1* 7/2020 Grasberg ................ G07C 9/27
11,169,657 B2* 11/2021 Rose ..................... G06F 3/0484
(Continued)

FOREIGN PATENT DOCUMENTS

| CN | 102074077 B | * | 3/2013 |
| CN | 111078497 A | * | 4/2020 |
| JP | 2000200233 A | * | 7/2000 |

OTHER PUBLICATIONS

Distributed Management Task Force. (Aug. 2019). Redfish Specification (No. DSP0266). DMTF. (Year: 2019).*

(Continued)

*Primary Examiner* — Daniel R Miller
*Assistant Examiner* — Eric Sebastian Von Wald
(74) *Attorney, Agent, or Firm* — Jeffrey Streets; Streets Lawfirm

(57) ABSTRACT

A baseboard management controller (BMC) installed in a server or other hardware device may perform operations to monitor and safeguard metering data for one or more hardware component of a server that includes the BMC. The BMC may periodically transmit a metering data message over a network to an event destination, where the metering data message includes the utilization levels of the hardware component during a period of operation. In response to detecting a loss of communication with the event destination, the BMC may perform lossy compression of the monitored utilization levels for the hardware component, wherein the lossy compression produces a utilization value that is representative of the monitored utilization levels, but uses less data storage capacity. The utilization value may be transmitted to the event destination instead of the monitored utilization levels in response to determining that communication with the event destination has been reestablished.

20 Claims, 4 Drawing Sheets

(58) Field of Classification Search
CPC . H04J 2203/0071; H04W 12/71; H04W 4/60; H04M 2215/0188; H03M 7/3059; H04Q 2209/60
See application file for complete search history.

(56) References Cited

U.S. PATENT DOCUMENTS

| | | | | |
|---|---|---|---|---|
| 2003/0135380 | A1* | 7/2003 | Lehr | H04M 15/00 705/22 |
| 2005/0193213 | A1* | 9/2005 | Johnson | G06F 21/121 713/187 |
| 2007/0220136 | A1* | 9/2007 | Raghunathan | B67D 1/0888 709/224 |
| 2008/0155092 | A1* | 6/2008 | Kumar | H04L 43/0817 709/224 |
| 2010/0313064 | A1* | 12/2010 | Boctor | H04L 43/0817 709/224 |
| 2011/0053513 | A1* | 3/2011 | Papakostas | H04L 67/535 455/67.11 |
| 2014/0280837 | A1* | 9/2014 | Ayanam | H04L 43/0817 709/223 |
| 2017/0060603 | A1* | 3/2017 | Aratsu | G05F 1/66 |
| 2018/0024578 | A1* | 1/2018 | Ahuja | G06F 1/206 700/300 |
| 2019/0086453 | A1* | 3/2019 | McLachlan | G06Q 30/04 |
| 2019/0281373 | A1* | 9/2019 | Sadasivarao | H04Q 11/0067 |
| 2020/0076715 | A1* | 3/2020 | Kondapalli | H04L 43/08 |
| 2021/0119891 | A1* | 4/2021 | Mundt | H04L 43/0829 |
| 2021/0157621 | A1* | 5/2021 | Galles | H04L 43/0876 |
| 2021/0240540 | A1* | 8/2021 | Wang | G06F 9/44505 |
| 2021/0318941 | A1* | 10/2021 | Heinrich | G06F 1/3206 |

OTHER PUBLICATIONS

Ashish, Singhal, et al. "Data Compression Issues with Pattern Matching in Historical Data." American Control Conference, 2003, p. 1. (Year: 2003).*

Hilland, Jeff "Redfish Eventing", www.DMTF.org, 2018, pp. 1-14.

* cited by examiner

RELIABLE HARDWARE METERING

BACKGROUND

The present disclosure relates to hardware component utilization data collection, management and reporting.

BACKGROUND OF THE RELATED ART

Hardware-as-a-service is a business model in which a service provider installs hardware at a customer's site and provides various other services related to the hardware. The hardware is still owned by the service provider and the customer pays for the service of using the hardware based on the amount that the hardware is used. The service provider may also have responsibilities for software, maintenance and operation of the hardware as set out in a service level agreement.

Since the service provider may retain responsibility for maintenance of the hardware and is paid based on how much the hardware is used, the service provider has an incentive to address problems proactively and avoid downtime. The customer is able to obtain the computing capacity that they need at a predictable monthly expense.

However, the hardware-as-a-service model requires reliable hardware metering data that forms the basis for determining usage and billing. The hardware metering data must be collected without any substantial consumption of system resources and must be resilient in the event of network downtime or other potential interruptions. In systems with a significant number of endpoints to be monitored, efficient and reliable collection of hardware metering data can be a challenge.

BRIEF SUMMARY

Some embodiments provide a computer program product comprising a non-volatile computer readable medium and non-transitory program instructions embodied therein, the program instructions being configured to be executable by a baseboard management controller to cause the baseboard management controller to perform various operations. The operations comprise monitoring utilization levels for at least one hardware component of a server in which the baseboard management controller is installed, and periodically transmitting a metering data message over a network connection to an event destination, wherein the metering data message includes the utilization levels of the at least one hardware component during a period of operation. The operations further comprise performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels. Still further, the operations comprise transmitting the one or more utilization value to the event destination instead of the monitored utilization levels in response to determining that communication with the event destination has been reestablished.

Some embodiments provide an apparatus comprising a non-volatile computer readable storage device storing non-transitory program instructions, and a baseboard management controller configured to process the program instructions. The program instructions are configured to, when processed by the baseboard management controller, cause the baseboard management controller to perform various operations. The operations comprise monitoring utilization levels for at least one hardware component of a server in which the baseboard management controller is installed, and periodically transmitting a metering data message over a network connection to an event destination, wherein the metering data message includes the utilization levels of the at least one hardware component during a period of operation. The operations further comprise performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels. Still further, the operations comprise transmitting the one or more utilization value to the event destination instead of the monitored utilization levels in response to determining that communication with the event destination has been reestablished.

DETAILED DESCRIPTION

Figure 1:
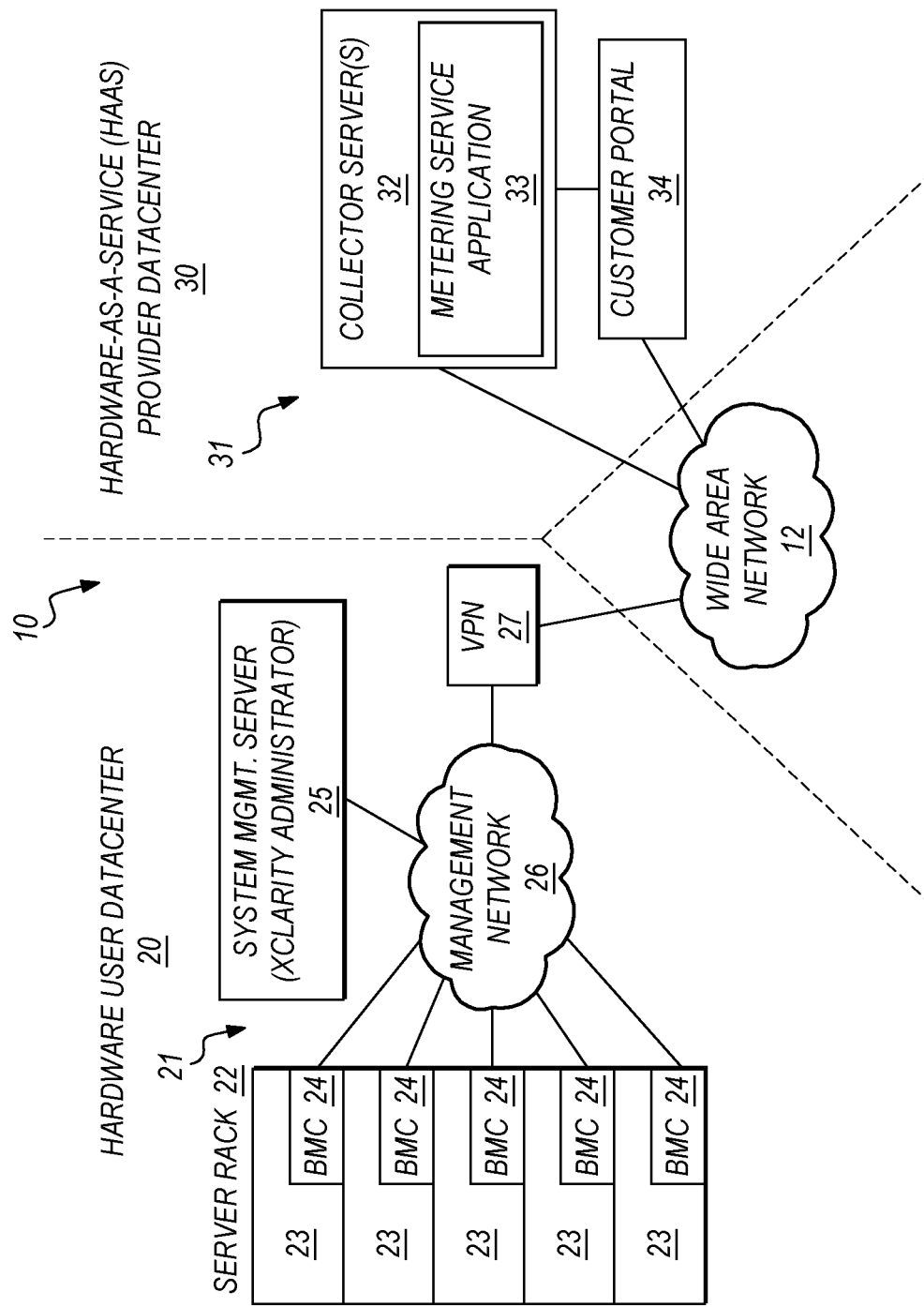
FIG. 1 is a diagram of a computing system located in a hardware user datacenter and a hardware-as-a-service (HaaS) provider datacenter.

Some embodiments provide a computer program product comprising a non-volatile computer readable medium and non-transitory program instructions embodied therein, the program instructions being configured to be executable by a baseboard management controller to cause the baseboard management controller to perform various operations. The operations comprise monitoring utilization levels for at least one hardware component of a server in which the baseboard management controller is installed, and periodically transmitting a metering data message over a network connection to an event destination, wherein the metering data message includes the utilization levels of the at least one hardware component during a period of operation. The operations further comprise performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels. Still further, the operations comprise transmitting the one or more utilization value to the event destination instead of the monitored utilization levels in response to determining that communication with the event destination has been reestablished.

A baseboard management controller (BMC) is a specialized service processor that monitors the physical operation of a computing device using sensors. In one example, the computing device is a server wherein the BMC resides on the motherboard of the server. The BMC may monitor the operation of various hardware components on the server, such as the central processor(s), memory, data storage devices, a network adapter, and various expansion buses and devices. In addition, the BMC may be able to monitor system temperatures, power supply voltage, and fan speed. The BMC may also communicate with a system administrator over a network connection, and has the ability to reboot the server.

The utilization levels of a hardware component may vary depending upon the type of sensors that the BMC has available to monitor each particular hardware component and/or the type of data that the BMC can access from the particular hardware component. Some embodiments may monitor CPU and memory utilization (i.e., percent utilization) and/or component or overall power consumption (i.e., kilowatt hours). However, other or additional telemetry data may also be included.

The BMC may communicate with a system administrator to support management of the server and may also periodically transmit a metering data message over a network connection to an event destination. Without limitation, the event destination may be a remote collector server and/or the system administrator, such as a system management server. In some embodiments, the BMC may transmit a metering data message that includes utilization levels for one or more hardware component of a server in which the baseboard management controller is installed. The metering data message may be a Transmission Control Protocol and Internet Protocol (TCP/IP) message that is transmitted over a wide area network, such as the Internet. Optionally, the metering data message may be transmitted over a virtual private network (VPN). Furthermore, the metering data message may be received by a metering service application that is executed on the remote collector server.

In some embodiments, the BMC may implement a persistent subscription to reliably convey metering data to the event destination, such as the collector server. The collector server or other event destination may contact the BMC to establish the subscription when the hardware is initially installed and configured for use in the hardware user datacenter. The subscription causes the BMC to report hardware metering data that is critical to usage and billing in a Hardware-as-a-Service (HaaS) computing system. The subscription is especially useful for a large scale system where polling a large number of endpoints is not effective. One non-limiting example of a Hardware-as-a-Service (HaaS) computing system is provided by Lenovo TruScale Infrastructure Services.

In some embodiments, the BMC may execute program logic that implements a version of Redfish. Redfish is an open-source management standard created by the Distributed Management Task Force (DMTF). Redfish program instructions may be executed by the BMC to allow an authorized user to enable a subscription that implements server-sent eventing (SSE), with an optional "retry forever" mechanism for transmitting metering data messages. During normal operation, the BMC of each server will "push" hardware metering data to an event destination, such as a collector server in the HaaS provider datacenter. The hardware metering data is important to a HaaS provider, since the metering data is the basis for all billing for the use of the hardware. A greater amount of hardware use allows the Haas provider to bill a greater fee. So, lost hardware metering data can represent a loss of income. Accordingly, embodiments are directed to operations that preserve the metering data and make the best possible effort to deliver the metering data to the collector server even in the event of an interruption in connectivity.

While it is possible to use Redfish functionality to set up a basic subscription that causes the BMC to report metering data to an event destination, current versions of Redfish are only capable of responding to a failed transmission by attempting a subsequent retransmission. After a given number of failed delivery attempts, the current versions of Redfish will terminate the subscription or place the subscription on hold. Accordingly, an administrator of the collector server must actively monitor the rate of incoming events (metering data messages) from individual systems (BMCs of each server) and manually identify any gaps in the reporting of metering data. The administrator must then reestablish the subscription to the BMC and retrieve (pull) the missed metering data (utilization levels). However, this effort requires user interaction and reconfiguration of the BMC, which is not efficient. Furthermore, there are limitations on how much data an endpoint server can buffer and provide after the subscription service has been recovered. Embodiments described herein address these problems and provide the technological solution of detecting a loss of communication with the collector server and managing the hardware component utilization levels until communication is restored.

In some embodiments, each baseboard management processor (BMC) in the hardware user's datacenter may perform operations to monitor whether or not each attempted transmission of a metering data message has been successfully received by the collector server. The BMC may confirm each successful transmission of metering data to the collector server and detect any unsuccessful attempts to transmit metering data to the collector server. For example, the BMC may monitor for confirmation messages received from the collector server indicating that a particular metering data message was received. Optionally, the metering data is maintained at least until the BMC has confirmed that the metering data has been received by the collector server. In some embodiments, the BMC may delete metering data for which a confirmation message has been received. Optionally, the metering data message may include a cyclic redundancy check (CRC) value to facilitate end-to-end verification of the metering data.

In some embodiments, the BMC may enable a "retry forever" mode of operation, such that the BMC, in response to detecting that an attempted transmission of a metering data message has failed, will simply make a further attempt ("try again") to transmit the metering data message that was determined to have failed. A "retry forever" mode will prevent the subscription from terminating and, therefore, the subscription does not ever need to be reestablished. However, a "retry forever" mode of operation, by itself, may be inefficient and/or ineffective. In some embodiments, the BMC may reduce the frequency at which it attempts retransmission of metering data messages and/or may replace the metering data message with a heartbeat signal until communication with the collector server has been restored.

In some embodiments, in response to detecting that an attempted transmission of a metering data message has failed, the BMC may buffer metering data that has not yet been successfully transmitted to the collector server. In other words, the BMC may buffer metering data until the collector server has confirmed receipt and acceptance of the metering data message. The BMC may buffer the relevant metering data in its own local memory or any memory available to the BMC on the same server where the BMC resides. The BMC may perform any operations to ensure that metering data representative of the actual hardware utilization can eventually be transmitted to the collector server. In the event of a temporary loss of communication between the BMC and the collector server, the buffered metering data may be retransmitted to the collector server once communication with the collector server has been restored.

In some embodiments, the BMC may perform enhanced buffering of the metering data during periods that transmissions to the event destination have failed. Optionally, the BMC may begin enhanced buffering of metering data in response to a period of time since the last successful transmission of metering data exceeding a setpoint period of time. Enhanced buffering may include various numerical techniques to reduce the amount of memory required to store the metering data or to enable a growing amount of data to be stored in a given amount of memory. Such enhanced buffering may be referred to as "lossy compression", which involves data reduction while retaining partial data or calculated values that are representative of the original data. Non-limiting examples of such lossy compression include averaging of data points or reducing the metering data resolution. For example, the average utilization levels for a given hardware component over a five minute period may be determined and may be just as useful to the collector server for billing purposes as would a separate usage value every second over the same five minute period. Accordingly, the BMC may maintain an average utilization of one or more hardware component using much less memory than storing all of the original utilization data underlying the average utilization value. In another example of lossy compression, the resolution of metering data may be reduced, such as collecting the metering data on a reduced frequency and/or storing only a fraction of the metering data during a period of time. In one illustration, if the BMC typically captures a hardware component utilization level once every second during a first period of operation in which transmission of metering data messages is being successful, then the BMC might capture or store a hardware component utilization level once every minute during a second period of operation in which transmission of metering data messages has failed.

In some embodiments, if the BMC determines that any one or more attempted transmission of a metering data message has failed, then the BMC will perform remediation operations in response to the failed attempts. For example, the BMC may maintain a log including a plurality of records, each record identifying a metering data message that has failed to be communicated to the event destination, a failure type that prevented communication of the metering data message, and the associated utilization data that has not been successfully communicated to the event destination as result of the failure. Furthermore, the log and a utilization value that is representative of the utilization data identified in each record of the log may be transmitted to the event destination once communication is restored. The log of failed metering data messages may be included in a metering health report and used for remediation based on failure type. For example, the metering health report may be used to determine how long the BMC was experiencing an issue in transmitting metering data as well as the details about the failure(s), so that networking issues or authentication issues can be determined and those portions of the system can be inspected to determine the root cause of the transient issue and prevent future issues. One embodiment of the health report identifies a type of error that occurred during transmission of the metering data message, a number of delivery attempts, and/or timestamps for those delivery attempts. The type of error may indicate whether the failure was a result of a network transmission problem that prevented delivery of the metering data message, an application IP address or operating problem that prevented receipt of the metering data message, or an authentication or verification problem that prevented acceptance of the metering data message.

In some embodiments, the BMC may detect a transmission failure type for each attempted transmission of the metering data message that has failed. For example, the transmission failure type may be a network connectivity failure that prevented the message from being forwarded to the collector server or the transmission failure type may be an authentication error that prevented the collector server from accepting the metering data that accompanied the message.

In some embodiments, the BMC may detect that the loss of communication with the event destination is a result of a network connectivity failure, periodically transmit a network heartbeat signal to the event destination in response to detecting the network connectivity failure, and monitor for a network heartbeat reply signal from the event destination, wherein receipt of a network heartbeat reply signal indicates that communication with the event destination has been reestablished. Optionally, the BMC may detect that the loss of communication with the event destination is a result of a network connectivity failure by receiving a network error code indicating that the metering data message could not be transmitted over the network. Periodically transmitting a network heartbeat signal uses fewer resources than periodically retransmitting the metering data message and the associated metering data.

In some embodiments, the BMC may detect that the loss of communication with the event destination is a result of an application communication failure, periodically transmit an application heartbeat signal to the event destination in response to detecting the application communication failure, and monitor for an application heartbeat reply signal from the event destination, wherein receipt of an application heartbeat reply signal indicates that communication with the event destination has been reestablished. Optionally, the BMC may detect that the loss of communication with the event destination is a result of an application communication failure by receiving an application return code indicating that the application refused to accept the metering data message. For example, the application return code may indicate that the metering data message could not be authenticated. For example, the metering service application that runs on the collector server may refuse to receive a metering data message from the BMC if the message cannot be authenticated. If the message arrives without credentials that are acceptable to the metering service application, then the metering service application sends a reply message to the BMC stating that there was an authentication error associated with a given metering data message. In addition, the application return code may indicate whether the cause of the communication failure is temporary or permanent. Authentication errors may be handled by a Redfish/HTTPS service. Network connectivity issues may be detected by the BMC, such as including network error detection/handling below the Redfish/HTTPS service.

In some embodiments, the BMC may respond in various ways that depend upon the communication failure type. For example, if the BMC detects a network connectivity failure, then the BMC may immediately reduce the frequency of attempted retransmissions. Furthermore, the BMC may implement a network heartbeat test in which the BMC attempts to send a simple heartbeat signal to the collector server, and may temporarily suspend the retransmission of the metering data messages. Fewer system resources are consumed via a heartbeat test than repeatedly attempting retransmission of the metering data message. However, if the BMC receives a heartbeat response from the collector server, then the BMC may attempt sending the health report and/or the metering data associated with each of the metering data messages for which transmission has failed, and the BMC may also resume the regular transmission of metering data messages. Optionally, the health report and/or the metering data associated with each of the metering data messages for which transmission has failed may be sent via an email-based or communication channel.

In some embodiments, the BMC may perform an application heartbeat test from the BMC to the metering service application to determine when to attempt sending a health report. An application heartbeat tests whether the metering service application is running, whereas a network heartbeat test may determine whether the endpoint (collector server) exists. For example, a network heartbeat may include a "ping" command. However, an endpoint may respond to pings, yet may not be running an HTTPS service, for example. In the case that the metering service application is down (not running) on the collector server, the network heartbeat test may be successful while the application heartbeat test may be unsuccessful.

In some embodiments, the BMC may also push the hardware metering data to a plurality of event destinations, such as the collector server and also the system management server in the hardware user datacenter. In such embodiments, the BMC may perform operations for monitoring and remediating the transmission of metering data to each event destination in the same manner that the BMC performs monitoring and remediating operations relative to metering data message transmissions to the remote collector server.

Some embodiments provide an apparatus comprising a non-volatile computer readable storage device storing non-transitory program instructions, and a baseboard management controller configured to process the program instructions. The program instructions are configured to, when processed by the baseboard management controller, cause the baseboard management controller to perform various operations. The operations comprise monitoring utilization levels for at least one hardware component of a server in which the baseboard management controller is installed, and periodically transmitting a metering data message over a network connection to an event destination, wherein the metering data message includes the utilization levels of the at least one hardware component during a period of operation. The operations further comprise performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels. Still further, the operations comprise transmitting the one or more utilization value to the event destination instead of the monitored utilization levels in response to determining that communication with the event destination has been reestablished.

The foregoing apparatus may further include program instructions for implementing or initiating any one or more aspects of the computer program products described herein. In other words, the baseboard management controller of the apparatus may perform the operations set out in the computer program product. Accordingly, a separate description of the operations will not be duplicated in the context of an apparatus. The foregoing apparatus may further process the program instructions to implement or initiate any one or more operation of the computer program product described herein.

FIG. 1 is a diagram of a computing system 10 located in a hardware user datacenter 20 and a hardware-as-a-service (HaaS) provider datacenter 30. The HaaS service provider (or simply "service provider") may have installed the hardware computing system 21 in the hardware user datacenter 20, and may have a service level agreement (SLA) with the hardware user (or simply "customer") to provide maintenance of the computing system 21. Furthermore, the service provider may be paid for the service of providing and maintaining the computing system 21 as a function of the utilization levels of hardware components within the computing system 21. Utilization levels of hardware components within the computing system 21 are very important to the service provider.

In the illustration of FIG. 1, the computing system 21 includes a plurality of servers 23 stored in a server rack 22. Each server 23 may perform processes that are of value to the customer or hardware user, while the BMC 24 of each server 23 monitors the operation of the hardware components within the respective server 23. Each BMC 24 may provide operating data to the system management server 25 over a management network 26, and the system management server 25 may provide instructions and/or updates to one or more BMC 24 via the management network 26. One example of the system management server 25 may execute XClarity™ Administrator management software available from Lenovo.

The service provider also has their own service provider datacenter 31. A collector server 32 in the service provider datacenter 31 may execute a metering service application 33 that is used to monitor metering data from the customer's computing system 21. During installation of the servers 23 at the customer datacenter 20, each BMC 24 is setup with a subscription to report metering data, including utilization levels for one or more of the hardware components within the server 23 in which the BMC 24 resides. For example, the subscription may provide the BMC 24 with the Internet Protocol (IP) address of the collector server 32 so that the BMC can periodically transmit a metering data message over a wide area network (WAN) 12, such as the Internet, using a virtual private network (VPN) 27. In this manner, the metering service application 33 is provided with timely messages include utilization levels for hardware components of each server 23. The metering service application 33 may then monitor the utilization levels over a period of time and calculate an invoice amount to charge the customer for use of the hardware that is installed in the datacenter 20. Optionally, the utilization levels obtained by the metering service application 33 may also be provided to a customer portal 34, which is accessible to the customer for querying their account data including the utilization levels and the resulting charges.

Figure 2:
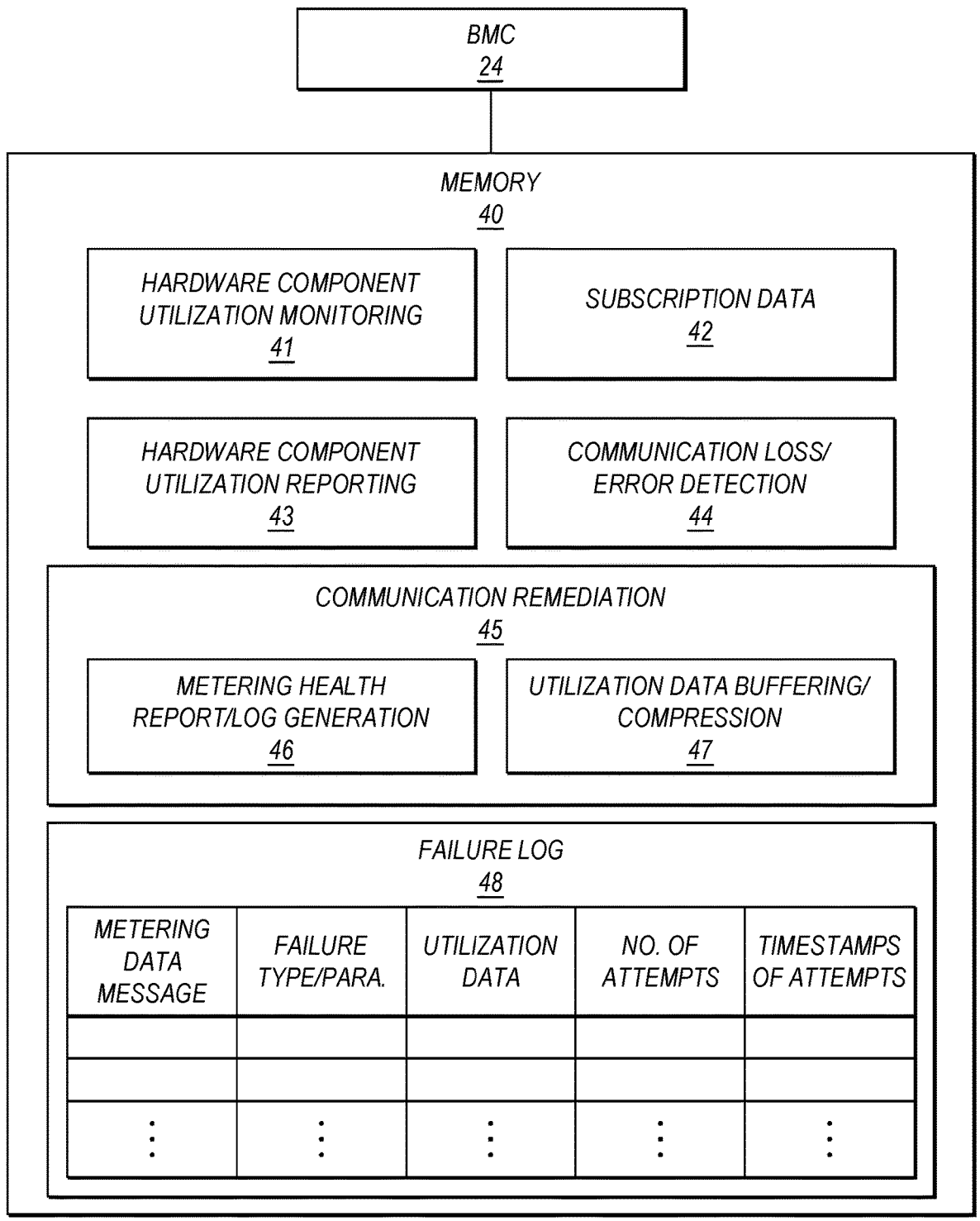
FIG. 2 is a diagram of logic and data modules that may be used to implement some embodiments.

FIG. 2 is a diagram of logic and data modules that may be used to implement some embodiments. The BMC 24 is a service processor that executes program instructions in order to perform various operations. The program instructions are stored in memory 40 that is accessible to the BMC 24. The program instructions may be implemented in various manners, but are illustrated here as being grouped into logic modules and data files stored in the memory 40.

A hardware component utilization monitoring module 41 may include program instructions for causing the BMC 24 to monitor the utilization levels of one or more hardware component of the server in which the BMC resides. A subscription data module 42 may store an IP address for an event destination, such as the collector server 32 in FIG. 1, as well as the hardware components for which utilization levels should be transmitted to the event destination. A hardware component utilization reporting module 43 may use the IP address and hardware component identification in the subscription data module 42 and the utilization levels obtained by the hardware component utilization monitoring module 41 to prepare and transmit a metering data message or report to the event destination.

A communication loss and error detection module 44 causes the BMC to detect whether communication with the event destination has been lost. The communication loss and error detection module 44 may also detect or receive error messages indicating whether the communication loss was due to a network error or an application error. A communication remediation module 45 may be used in response to a loss of communication with the event destination. For example, the communication remediation module 45 may include a metering health report or log generation module 46 and a utilization data buffering or compression module 47. The metering health report or log generation module 46 may keep track of metering data messages that have experience a failed transmission to the event destination. In one illustration, the metering health report or log generation module 46 maintains a failure log 48 including a plurality of records (illustrated as rows of a table), wherein each record may include identification of a metering data message, failure type or parameter, utilization data, number of attempts, and/or timestamps for each of the attempts. If there are a number of failures over a period of time, the amount of metering data may surpass the available memory capacity available for storing such data. Before that happens, a utilization data buffering or compression module 47 may begin reducing the amount of data that is stored without giving up on at least some record of hardware component utilization during the same period that communication is lost. For example, a lossy compression, such as averaging and/or data reduction, may be implemented by the utilization data buffering or compression module 47.

Figure 3:
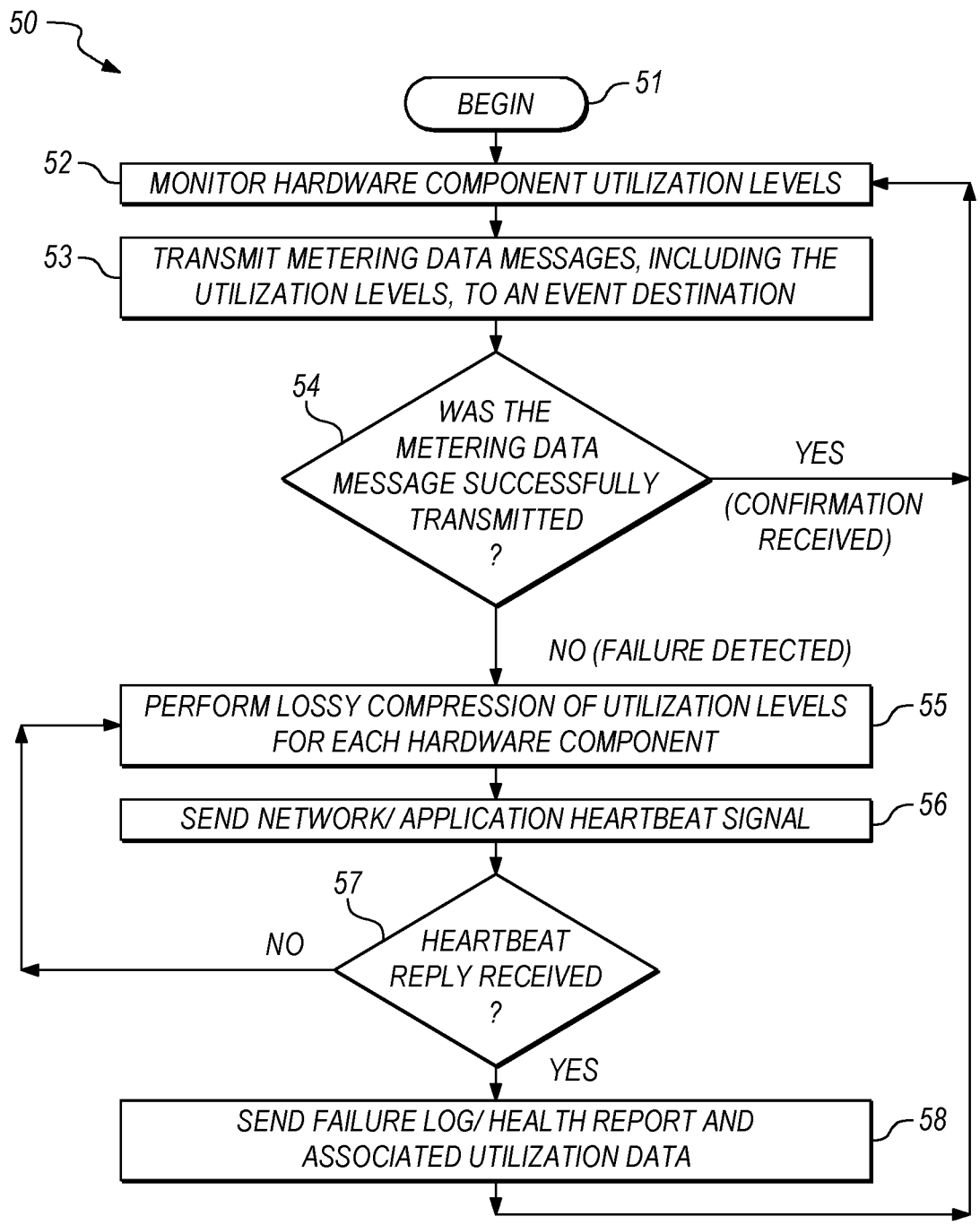
FIG. 3 is a flowchart of operations according to some embodiments.

FIG. 3 is a flowchart of a method 50 according to some embodiments. The method 50 begins in operation 51. In operation 52, the BMC monitors hardware component utilization levels for at least one hardware component of a server in which the baseboard management controller is installed. In operation 53, the BMC periodically transmits a metering data message including the utilization levels over a network connection to an event destination, wherein the metering data message includes the utilization levels of the at least one hardware component during a period of operation. Operation 54 determines whether the metering data message was successfully transmitted to the event destination. For example, a successful transmission may be determined by receiving a confirmation message from the event destination. An unsuccessful transmission (i.e., failed transmission) may be determined either by receiving an error message or by the expiration of a time period since the transmission was sent without receiving a confirmation message.

If the metering data message was not successfully transmitted, then operation 55 performs lossy compression of the monitored utilization levels for the at least one hardware component of the server. The lossy compression produces one or more utilization value that is representative of the monitored utilization levels and uses less data storage capacity than the monitored utilization levels. In operation 56, the BMC may sent a network heartbeat signal and/or an application heartbeat signal to detect whether communication with the event destination has been restored. If a heartbeat reply is not received, then the lossy compression is continued for the ongoing collection of utilization level data from hardware components in the server in operation 55. However, if a heartbeat reply is determined to have been received in operation 57, then the BMC sends a failure log or health report and associated utilization data to the event destination in operation 58. Operation 58 may, for example, include transmitting the one or more utilization value obtain by lossy compression to the event destination instead of the monitored utilization levels.

Figure 4:
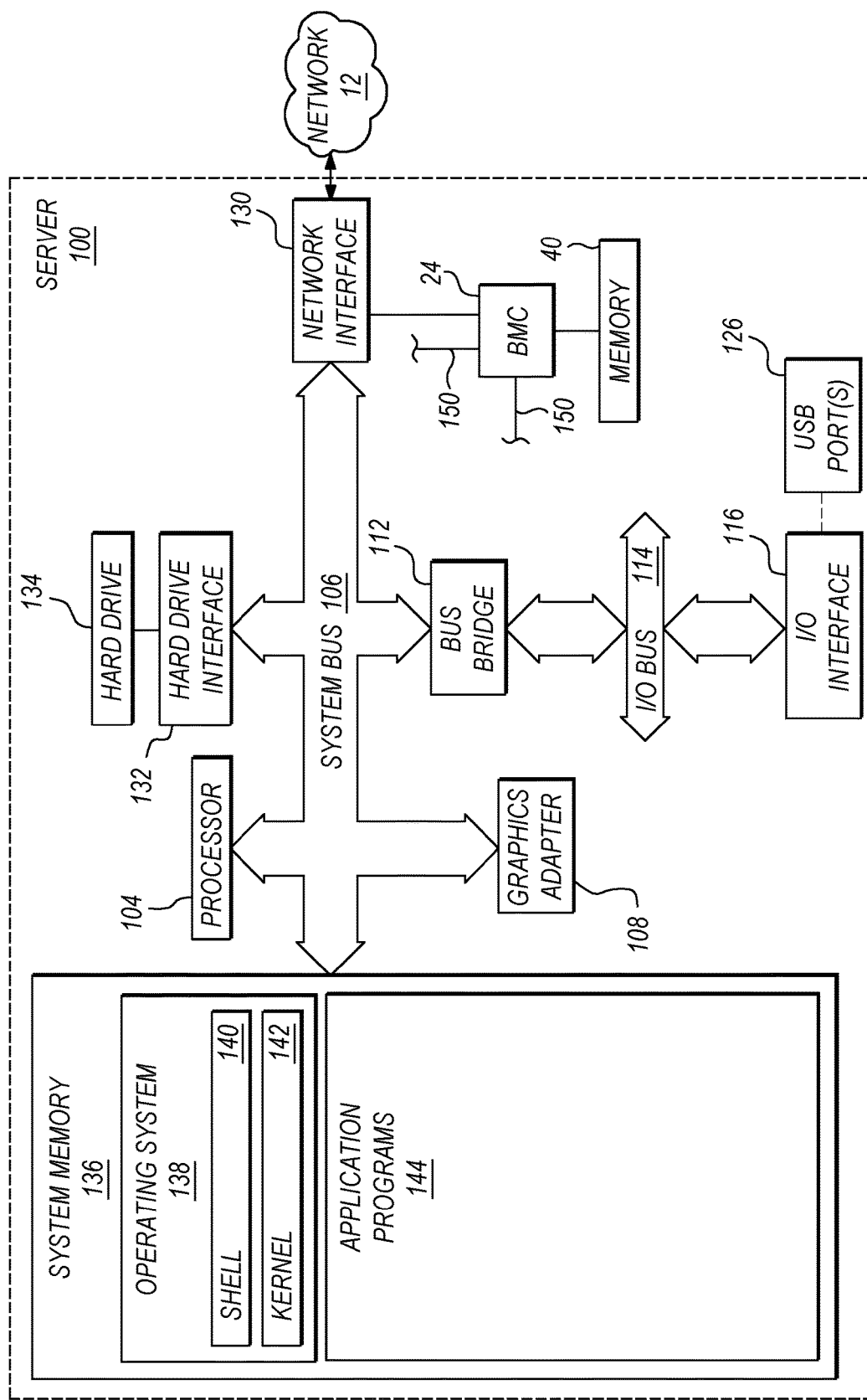
FIG. 4 is a block diagram of a server.

FIG. 4 is a block diagram of a server 100 that may, without limitation, be representative of the configuration of one of the servers 23 of FIG. 1. Furthermore, the architecture of the server 100 may, without limitation, also be generally representative of the hardware architecture of the system management server 25 and the collector server 32. However, there is no requirement that the servers have the same configuration and the embodiments are not limited to the particular architecture shown.

The server 100 includes a processor unit 104 that is coupled to a system bus 106. The processor unit 104 may utilize one or more processors, each of which has one or more processor cores. A graphics adapter 108 is also coupled to system bus 106 and may, for example, include a graphics processing unit (GPU). The system bus 106 is coupled via a bus bridge 112 to an input/output (I/O) bus 114 that supports an I/O interface 116. The I/O interface 116 affords communication with various I/O devices, such as an optional keyboard and/or a USB mouse 124 via USB port(s) 126. As depicted, the server 100 is able to communicate with the network 12 using a network interface controller 130.

A hard drive interface 132 is also coupled to the system bus 106. The hard drive interface 132 interfaces with a hard drive 134. In a preferred embodiment, the hard drive 134 communicates with system memory 136, which is also coupled to the system bus 106. System memory may be the lowest level of volatile memory in the computer 100. This volatile memory may include additional higher levels of volatile memory (not shown), including, but not limited to, cache memory, registers and buffers. Data that populates the system memory 136 may include an operating system (OS) 138 and application programs 144.

The operating system 138 for the server 100 may include a shell 140 for providing transparent user access to resources such as the application programs 144. Generally, the shell 140 is a program that provides an interpreter and an interface between the user and the operating system. More specifically, the shell 140 executes commands that are entered into a command line user interface or from a file. Thus, the shell 140, also called a command processor, is generally the highest level of the operating system software hierarchy and serves as a command interpreter. The shell may provide a system prompt, interpret commands entered by keyboard, mouse, or other user input media, and send the interpreted command(s) to the appropriate lower levels of the operating system (e.g., a kernel 142) for processing. Note that while the shell 140 may be a text-based, line-oriented user interface, embodiments may support other user interface modes, such as graphical, voice, gestural, etc.

As depicted, the operating system 138 also includes the kernel 142, which may include lower levels of functionality for the operating system 138, including providing essential services required by other parts of the operating system 138 and application programs 144. Such essential services may include memory management, process and task management, disk management, and mouse and keyboard management.

The server 100 also includes the baseboard management controller 24 and the memory 40 of FIG. 2. The BMC 24 has any number of communication lines 150 that may extend to various hardware components of the server 100 for sensing one or more utilization levels and/or communicating with the hardware components to receive one or more utilization levels. Without limitations, the BMC may communicate over communication lines 150 with the processor 104, system memory 136, the hard drive interface 132 and the network interface 130. Furthermore, the BMC 24 may be connected to the network interface controller 130 for the purpose of transmitting metering data messages, heartbeats and/or health reports and utilization values to the even destination over the network 12.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. A computer program product comprising a non-volatile computer readable medium and non-transitory program instructions embodied therein, the program instructions being configured to be executable by a baseboard management controller to cause the baseboard management controller to perform operations comprising:
    monitoring utilization levels for at least one hardware component of a server in which the baseboard management controller is installed;
    periodically transmitting a metering data message over a network connection to an event destination, wherein the metering data message includes the utilization levels of the at least one hardware component during a period of operation;
    performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels;
    detecting that the loss of communication with the event destination is a result of a network connectivity failure;
    periodically transmitting, in response to detecting the network connectivity failure, a network heartbeat signal to the event destination;
    monitoring for a network heartbeat reply signal from the event destination, wherein receiving the network heartbeat reply signal indicates that communication with the event destination has been reestablished; and
    transmitting the one or more utilization value to the event destination instead of the monitored utilization levels in response to determining that communication with the event destination has been reestablished.

2. The computer program product of claim 1, wherein detecting that the loss of communication with the event destination is a result of a network connectivity failure, includes receiving a network error code indicating that the metering data message could not be transmitted over the network connection.

3. The computer program product of claim 1, the operations further comprising:
    deleting the one or more utilization value that is representative of the monitored utilization levels in response to receiving a confirmation message from the event destination indicating that the one or more utilization value has been received.

4. The computer program product of claim 1, wherein the lossy compression includes averaging of utilization levels over a period of time for a given hardware component among the one or more hardware components.

5. The computer program product of claim 1, wherein the lossy compression comprises averaging the utilization levels over a period of time for the at least one hardware component of the server, reducing a frequency at which the utilization levels are collected for the at least one hardware component of the server, and/or only storing a reduced fraction of the utilization levels for the at least one hardware component of the server.

6. The computer program product of claim 1, wherein the event destination is a remote collector server.

7. The computer program product of claim 1, wherein the event destination is a plurality of event destinations.

8. A computer program product comprising a non-volatile computer readable medium and non-transitory program instructions embodied therein, the program instructions being configured to be executable by a baseboard management controller to cause the baseboard management controller to perform operations comprising:
    monitoring utilization levels for at least one hardware component of a server in which the baseboard management controller is installed;
    periodically transmitting a metering data message over a network connection to an event destination, wherein the metering data message includes the utilization levels of the at least one hardware component during a period of operation;
    performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels;
    transmitting the one or more utilization value to the event destination instead of the monitored utilization levels in response to determining that communication with the event destination has been reestablished; and
    maintaining a log including a plurality of records, each record including the metering data message that has failed to be communicated to the event destination, wherein each record identifies the metering data message, a failure type that prevented communication of the metering data message, and the utilization levels that have not been successfully communicated to the event destination as result of the failure.

9. The computer program product of claim 8, wherein transmitting the one or more utilization value that is representative of the monitored utilization levels to the event destination, includes transmitting the log and a utilization value that is representative of the utilization levels identified in each record of the log.

10. The computer program product of claim 8, wherein each record of the log further includes a number of transmission attempts and a timestamp for each of the transmission attempts.

11. The computer program product of claim 8, wherein the lossy compression includes averaging of utilization levels over a period of time for a given hardware component among the one or more hardware components.

12. The computer program product of claim 8, wherein the lossy compression comprises averaging the utilization levels over a period of time for the at least one hardware component of the server, reducing a frequency at which the utilization levels are collected for the at least one hardware component of the server, and/or only storing a reduced fraction of the utilization levels for the at least one hardware component of the server.

13. An apparatus, comprising:
a non-volatile computer readable storage device storing non-transitory program instructions; and
a baseboard management controller configured to process the program instructions, wherein the program instructions are configured to, when processed by the baseboard management controller, cause the baseboard management controller to perform operations comprising:
monitoring utilization levels for at least one hardware component of a server in which the baseboard management controller is installed;
periodically transmitting a metering data message over a network connection to an event destination, wherein the metering data message includes the utilization levels of the at least one hardware component during a period of operation;
performing, in response to detecting a loss of communication with the event destination, lossy compression of the monitored utilization levels for the at least one hardware component of the server, wherein the lossy compression produces one or more utilization value that is representative of the monitored utilization levels and uses less data storage capacity than the monitored utilization levels;
detecting that the loss of communication with the event destination is a result of a network connectivity failure;
periodically transmitting, in response to detecting the network connectivity failure, a network heartbeat signal to the event destination;
monitoring for a network heartbeat reply signal from the event destination, wherein receiving the network heartbeat reply signal indicates that communication with the event destination has been reestablished; and
transmitting the one or more utilization value to the event destination instead of the monitored utilization levels in response to determining that communication with the event destination has been reestablished.

14. The apparatus of claim 13, the operations further comprising:
detecting that the loss of communication with the event destination is a result of an application communication failure of an application running on the event destination; and
periodically transmitting, in response to detecting the application communication failure, an application heartbeat signal to the application running on the event destination; and
monitoring for an application heartbeat reply signal from the event destination, wherein receiving the application heartbeat reply signal indicates that communication with the application running on the event destination has been reestablished.

15. The apparatus of claim 13, wherein the lossy compression includes averaging of utilization levels over a period of time for a given hardware component among the one or more hardware components.

16. The apparatus of claim 13, wherein the lossy compression includes reducing a resolution of the utilization levels for the at least one hardware component of the server.

17. The apparatus of claim 13, the operations further comprising:
maintaining a log including a plurality of records, each record including the metering data message that has failed to be communicated to the event destination, wherein each record identifies the metering data message, a failure type that prevented communication of the metering data message, and the utilization levels that have not been successfully communicated to the event destination as result of the failure, and wherein transmitting the one or more utilization value that is representative of the monitored utilization levels to the event destination, includes transmitting the log and the utilization data identified in each record of the log.

18. The computer program product of claim 17, wherein transmitting the one or more utilization value that is representative of the monitored utilization levels to the event destination, includes transmitting the log and a utilization value that is representative of the utilization levels identified in each record of the log.

19. The computer program product of claim 17, wherein each record of the log further includes a number of transmission attempts and a timestamp for each of the transmission attempts.

20. The computer program product of claim 13, wherein the event destination is a remote collector server.

\* \* \* \* \*